(12) United States Patent
Uesugi et al.

(10) Patent No.: US 7,291,283 B2
(45) Date of Patent: Nov. 6, 2007

(54) COMBINED WET ETCHING METHOD FOR STACKED FILMS AND WET ETCHING SYSTEM USED FOR SAME

(75) Inventors: Tadanori Uesugi, Akita (JP); Shigeru Kimura, Tokyo (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 49 days.

(21) Appl. No.: 10/704,562

(22) Filed: Nov. 12, 2003

(65) Prior Publication Data

US 2004/0104199 A1    Jun. 3, 2004

(30) Foreign Application Priority Data

Nov. 15, 2002    (JP)    ............... 2002-332954

(51) Int. Cl.
   *B44C 1/22*    (2006.01)
(52) U.S. Cl. ............... 216/41; 216/83; 216/95; 216/96; 216/90; 216/92; 216/100; 216/102; 438/978; 438/745; 438/747; 438/749; 438/750
(58) Field of Classification Search .............. 216/41
   See application file for complete search history.

(56) References Cited

U.S. PATENT DOCUMENTS

| | | | | |
|---|---|---|---|---|
| 5,211,807 A | * | 5/1993 | Yee | ............... 216/100 |
| 5,609,773 A | * | 3/1997 | Usui et al. | ............... 216/20 |
| 6,215,077 B1 | | 4/2001 | Utsumi et al. | |
| 6,329,300 B1 | | 12/2001 | Yamamoto | |
| 6,365,057 B1 | * | 4/2002 | Whitehurst et al. | ............ 216/13 |
| 6,433,842 B1 | | 8/2002 | Kaneko et al. | |
| 6,541,389 B1 | | 4/2003 | Kubo et al. | |
| 6,930,749 B2 | * | 8/2005 | Lee et al. | ............... 349/187 |

FOREIGN PATENT DOCUMENTS

JP    57-94572    6/1982

(Continued)

OTHER PUBLICATIONS

IBM Technical Disclosure Bulletin, Slope Formation and its Angle Control on Etching of Aluminum Gate Film (vol. 37, No. 05, May 1994).*

(Continued)

*Primary Examiner*—Duy-Vu N. Deo
*Assistant Examiner*—Patricia A. George
(74) *Attorney, Agent, or Firm*—Young & Thompson

(57) ABSTRACT

A combined wet etching method for stacked films which is capable of performing etching processes in a collective manner while controlling an amount of side-etching on each of stacked films and of making uniform side edges. In the wet etching method, two or more types of etching methods are performed in combination, on stacked films containing first and second films being deposited sequentially on a substrate and each having a different film property. The two or more types of wet etching methods include, at least, a first wet etching method in which side-etching on the first film is facilitated more than side-etching on the second film and a second wet etching method in which side-etching on the second film is facilitated more than side-etching on the first film.

16 Claims, 11 Drawing Sheets

FOREIGN PATENT DOCUMENTS

| | | |
|---|---|---|
| JP | 8-158069 | 6/1996 |
| JP | 2000-188277 | 7/2000 |
| JP | 2001-44166 | 2/2001 |
| JP | 2001-166336 | 6/2001 |
| JP | 2001-311954 | 11/2001 |
| JP | 2002-9061 | 1/2002 |
| JP | 2002-208582 | 7/2002 |
| TW | 00495855 | 2/2001 |
| TW | 00535195 | 12/2001 |

OTHER PUBLICATIONS

Of IBM Technical Disclosure Bulletin, Wet Etchant for Molybdenum Having High Selectivity Against Aluminum (vol. 35, No. 03, Aug. 1992).*

* cited by examiner

<cross-sectional view>

<plan view> after spray etching after paddle etching configuration of three-layered films after spray etching after paddle etching configuration of three-layered films after spray etching after immersion etching configuration of three-layered films after spray etching after immersion etching

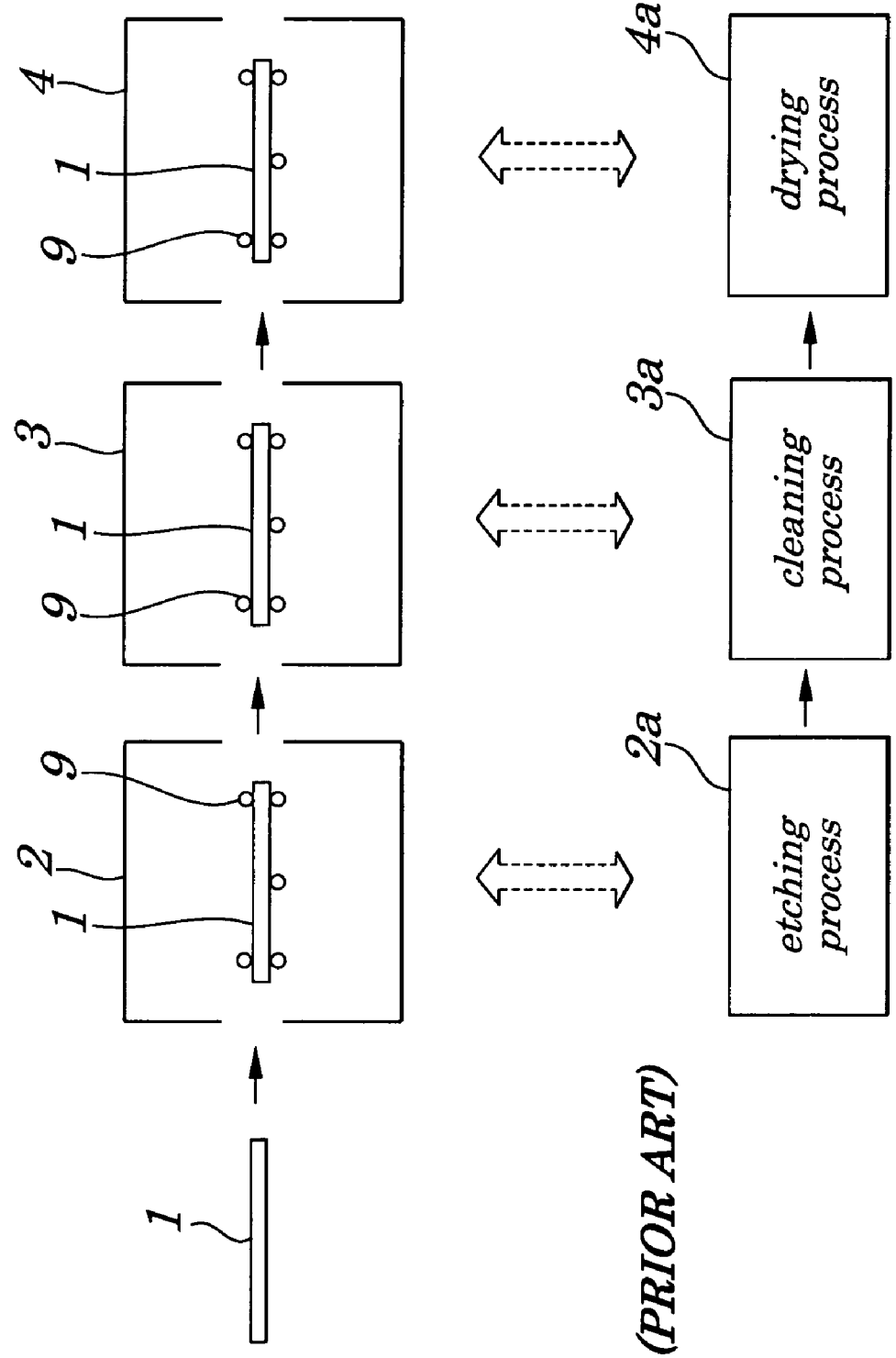

COMBINED WET ETCHING METHOD FOR STACKED FILMS AND WET ETCHING SYSTEM USED FOR SAME

BACKGROUND OF THE INVENTION

1. Field of the Invention

The present invention relates to a combined wet etching method for stacked films and a wet etching system used in the combined wet etching method for stacked films and more particularly to the combined wet etching method for stacked films for performing wet etching processes employing a plurality of types of wet etching methods in combination and in a collective manner on stacked films containing a plurality of films each having a different film property.

The present application claims priority of Japanese Patent Application No. 2002-332954 filed on Nov. 15, 2002, which is hereby incorporated by reference.

2. Description of the Related Art

In processes of manufacturing liquid crystal display devices and semiconductor devices, in order to perform thin-film patterning, an etching process is indispensable. However, in wet etching processes to be performed on a thin film, so-called a "side-etching" phenomenon occurs, in which the thin film is excessively etched not only from a direction of a surface of the thin film but also from a direction of a portion surrounding the thin film, thus making it impossible to achieve a uniform shape of the thin film to be obtained after having been etched. In process for patterning a wiring layer by using a wet etching process to form wirings made of metal materials in particular, very high etching accuracy is required. This is because, if an irregularity occurs in a pattern shape due to insufficient accuracy in the side-etching, it exerts a large influence on electrical properties of devices.

Moreover, with recent widespread usage of multi-layered liquid crystal display devices and/or semiconductor devices, an influence of a step existing on a lower-layer pattern wielded over a step coverage characteristic of the lower-layer pattern by an upper-layer pattern becomes large. In an etching process for patterning wiring layers in particular, in order to maintain an excellent step coverage characteristic by an upper-layer pattern, to ensure an insulation pressure resistance of an interlayer dielectric being put between an upper-layer and a lower-layer, to achieve normal conduction through upper-layer metal wirings, and to obtain reliability by avoiding occurrence of a defect in a protective film covering upper-layer metal wirings, so-called a "taper etching" process, in which a tapered portion is formed on a surface being wet-etched at time of patterning on lower layer wirings, is an important factor.

To achieve this purpose, when a single wiring material (single layer) is wet-etched, in many cases, impregnation of an etching liquid between a resist and wiring material is used by making an adjustment to the chemical composition of the etching liquid or by controlling resist adhesion.

FIGS. 10A and 10B each are an outline of a general wet etching process conventionally employed. As shown in FIGS. 10A and FIG. 10B, in the conventional wet etching, after a substrate to be treated 1 has been carried into an etching chamber 2 by a substrate carrying roller 9, by performing an etching process 2a using a single method, that is, using wet etching such as immersion etching (static etching using a static etching liquid) in which the substrate is immersed in an etching liquid, or spray etching (dynamic etching using a dynamic etching liquid) in which an etching liquid is sprayed on a substrate, or a like, parts (specified regions) of a thin film formed on the substrate to be treated 1 are etched.

Next, after the substrate to be treated 1 has been carried into a water cleaning chamber 3, a cleaning process 3a, as shown in FIG. 10B, is performed to remove the etching liquid (etchant) being left on the substrate to be treated 1. Then, after the substrate to be treated 1 has been carried into a drying chamber 4, a drying process 4a is performed to remove cleaning water being left on the substrate to be treated 1. Thus, patterning is achieved by performing the wet etching process on the thin film. Moreover, a wet etching system using the conventional spray etching method as described above is disclosed in Japanese Patent Application Laid-open No. Sho 57-094572. Also, another conventional wet etching method employed for etching on a single-layered film in which the spray etching method and the immersion etching method are used in combination, however, each of the spray etching method and the immersion etching method is performed in etching systems being different from each other is disclosed in Japanese Patent Application Laid-open No. Hei 08-158069.

However, a following problem occurs when the conventional wet etching methods as described above are employed for etching on stacked films. That, there is a problem in that, when an etching process by using a same etching liquid is performed, in general, a etching characteristic (that is, etching rate) varies depending on each wiring material and in that, when an etching process by using a same etching liquid is performed on a same wiring material, a etching characteristic varies depending on an etching method to be employed.

Due to this, if an etching process is performed by a single method on a plurality of stacked wiring materials (stacked films) in the same manner employed in the etching on a single-layered film, if an etching rate of a lower layer film is larger than that of an upper layer film, which is caused by a difference in the etching rate of each of the stacked films, a side-etching phenomenon in the lower layer film excessively occurs compared with that in the upper layer film, causing occurrence of a overhanging shape of the upper layer film in which the upper layer film protrudes toward the lower layer film in a hood form in some cases. This overhanging shape of the upper layer causes degradation of a step coverage characteristic of a film to be further stacked on the upper layer, thus causing occurrence of structural defects in the upper layer film.

In order to eradicate such the difference in an etching rate which varies depending on a wiring material, an etching method may be available in which formation of a tapered portion is controlled by using two kinds of etching liquids each having a different etching characteristic. However, due to deterioration in each of the etching liquids and/or due to complicated management of concentrations of the etching liquids, actual operations of this etching method is not easy.

SUMMARY OF THE INVENTION

In view of the above, it is an object of the present invention to provide a combined wet etching method to be performed on stacked films which is capable of performing etching processes in a collective manner while controlling an amount of side-etching on each of stacked films and a wet etching system to be used in the above combined wet etching method.

According to a first aspect of the present invention, there is provided a combined wet etching method for stacked films including:

a step of performing wet etching processes employing a plurality of types of wet etching methods in combination and in a collective manner on stacked films deposited sequentially on a substrate containing, at least, a first film and a second film each having a different film property; and wherein the plurality of types of wet etching methods includes;

a first wet etching step in which side-etching on the first film is facilitated more than side-etching on the second film; and a second wet etching step in which side-etching on the second film is facilitated more than side-etching on the first film.

In the foregoing, a preferable mode is one wherein an chemical composition of an etching liquid to be used in the first wet etching step and an chemical composition of an etching liquid to be used in the second wet etching step are same.

According to a second aspect of the present invention, there is provided a combined wet etching method for stacked films including:

a step of performing wet etching processes employing a plurality of types of wet etching methods in combination and in a collective manner on stacked films deposited sequentially on a substrate containing, at least, a first film and a second film each having a different film property; and wherein the plurality of types of wet etching methods includes;

a first wet etching step in which an etching characteristic is obtained that an etching rate of the first film is larger than an etching rate of the second film;

a second wet etching step in which an etching characteristic is obtained that an etching rate of the second film is larger than an etching rate of the first film.

In the foregoing, a preferable mode is one wherein an chemical composition of an etching liquid to be used in the first wet etching step and an chemical composition of an etching liquid to be used in the second wet etching step are same.

Also, a preferable mode is one wherein, when a dynamic etching liquid is used in the first wet etching step, a static etching liquid is used in the second wet etching step and, when a static etching liquid is used in the first wet etching step, a dynamic etching liquid is used in the second wet etching step.

Also, a preferable mode is one wherein an etching step in which the dynamic etching liquid is used is an etching step in which an etching process is performed by spraying an etching liquid on the stacked films deposited on the substrate and an etching step in which the static etching liquid is used is an etching step in which an etching process is performed by immersing the substrate on which the stacked films are deposited in an etching liquid or an etching step in which a coating of an etching liquid is applied to the stacked films deposited on the substrate.

Also, a preferable mode is one wherein the stacked films are constructed so that the first film is sandwiched between the second films or so that the second film is sandwiched between the first films.

According to a third aspect of the present invention, there is provided a wet etching system having a function of performing dynamic wet etching using a dynamic etching liquid and a function of performing static wet etching using a static etching liquid.

According to a fourth aspect of the present invention, there is provided a wet etching system having a function of consecutively performing dynamic wet etching using a dynamic etching liquid and static wet etching using a static etching liquid.

In the foregoing, a preferable mode is one wherein the dynamic wet etching is an etching process to be performed by spraying an etching liquid on a substrate to be treated and the static wet etching is an etching process to be performed by immersing a substrate to be treated in an etching liquid or to be performed by applying a coating of an etching liquid to a substrate to be treated.

With the above configurations, in stacked films containing two and more kinds of films each having a difference in an etching rate occurring when the spray etching process and immersion etching process are performed, when the spray etching process and paddle etching process are performed, and when the immersion etching process and paddle etching process are performed, by performing the spray etching process and immersion etching process in a collective manner, or the spray etching process and paddle etching process in a collective manner, or the immersion etching process and paddle etching process in a collective manner, an amount of side-etching on each of stacked films can be controlled, thus achieving patterning of stacked films each having an excellent side edge (film edge) to be obtained after the etching processes.

BRIEF DESCRIPTION OF THE DRAWINGS

The above and other objects, advantages, and features of the present invention will be more apparent from the following description taken in conjunction with the accompanying drawings in which:

FIGS. 10A and 10B each are an outline of a conventional wet etching process; and FIGS. 10A and 11B each are an outline of a wet etching process of the present invention.

DETAILED DESCRIPTION OF THE PREFERRED EMBODIMENTS

Best modes of carrying out the present invention will be described in further detail using various embodiments with reference to the accompanying drawings.

Figure 11A:
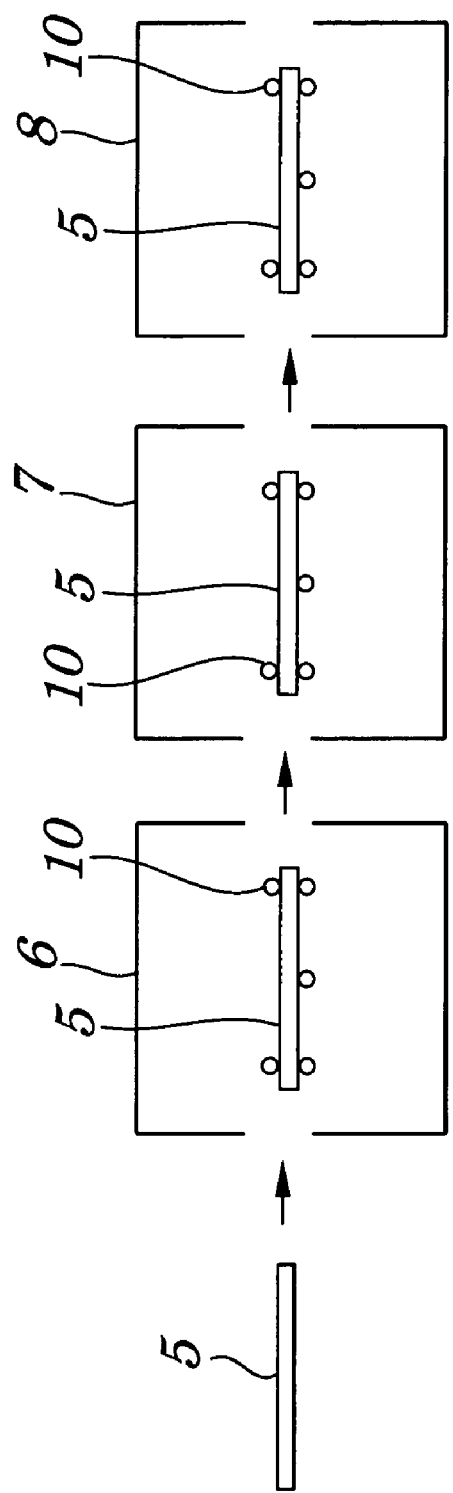
Figure 11B:
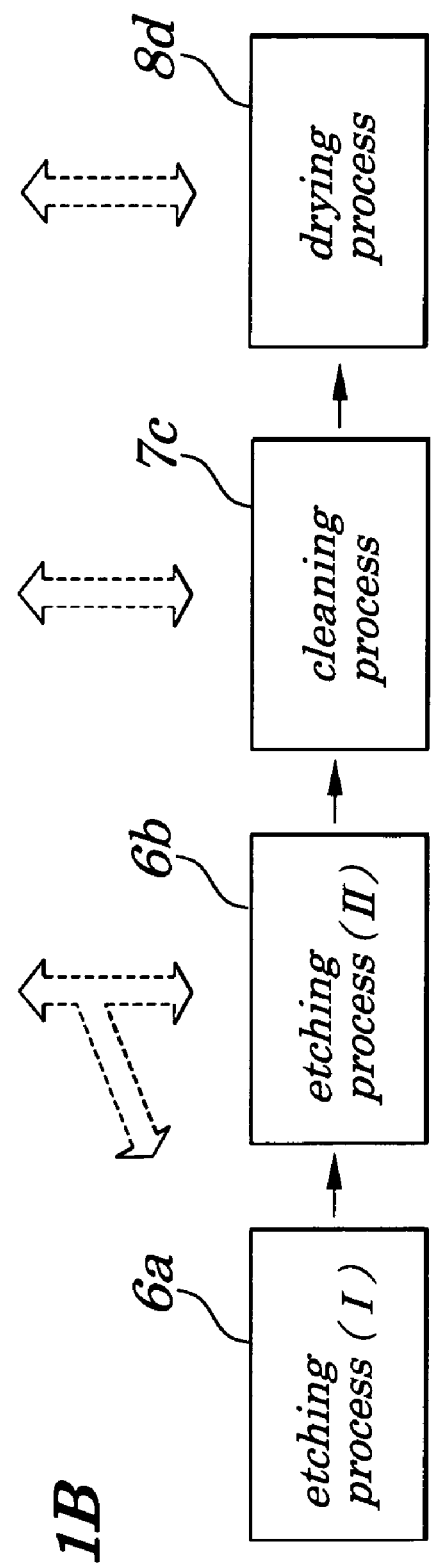

Before describing each embodiment, an outline of wet etching processes of the present invention is described. As shown in FIGS. 11A and 11B, after a substrate to be treated 5 has been carried by a substrate carrying roller 10 into an etching chamber 6, an etching process 6a ("Etching I" in FIG. 11B) including a spray etching process (dynamic wet etching process using a dynamic etching liquid) or an immersion etching process (static wet etching process using a static etching liquid) is performed on the substrate to be treated 5 to perform wet etching on parts (specified regions of stacked films formed on the substrate to be treated 5.

Then, in the same etching chamber 6, an etching process 6b ("Etching II" in FIG. 11B) being different from the etching process 6a including the immersion etching process, spray etching process or a like, is performed on the substrate to be treated 5 to achieve patterning on stacked films formed on the substrate to be treated 5 by using the wet etching method. Next, after the substrate to be treated 5 has been carried into a water cleaning chamber 7, a cleaning process 7c is performed to remove an etching liquid (etchant) and further, after the substrate to be treated 5 has been carried into a drying chamber 8, a drying process 8d is performed to remove water used for cleaning.

That is, in the present invention, an etching process 2a shown in FIG. 10B illustrating the conventional process is divided into two processes including the first etching process 6a and the second etching process 6b shown in FIG. 11B illustrating the etching processes of the present invention in which the first etching process 6a and the second etching process 6b are performed in combination and in a collective manner.

First Embodiment

Figure 1:
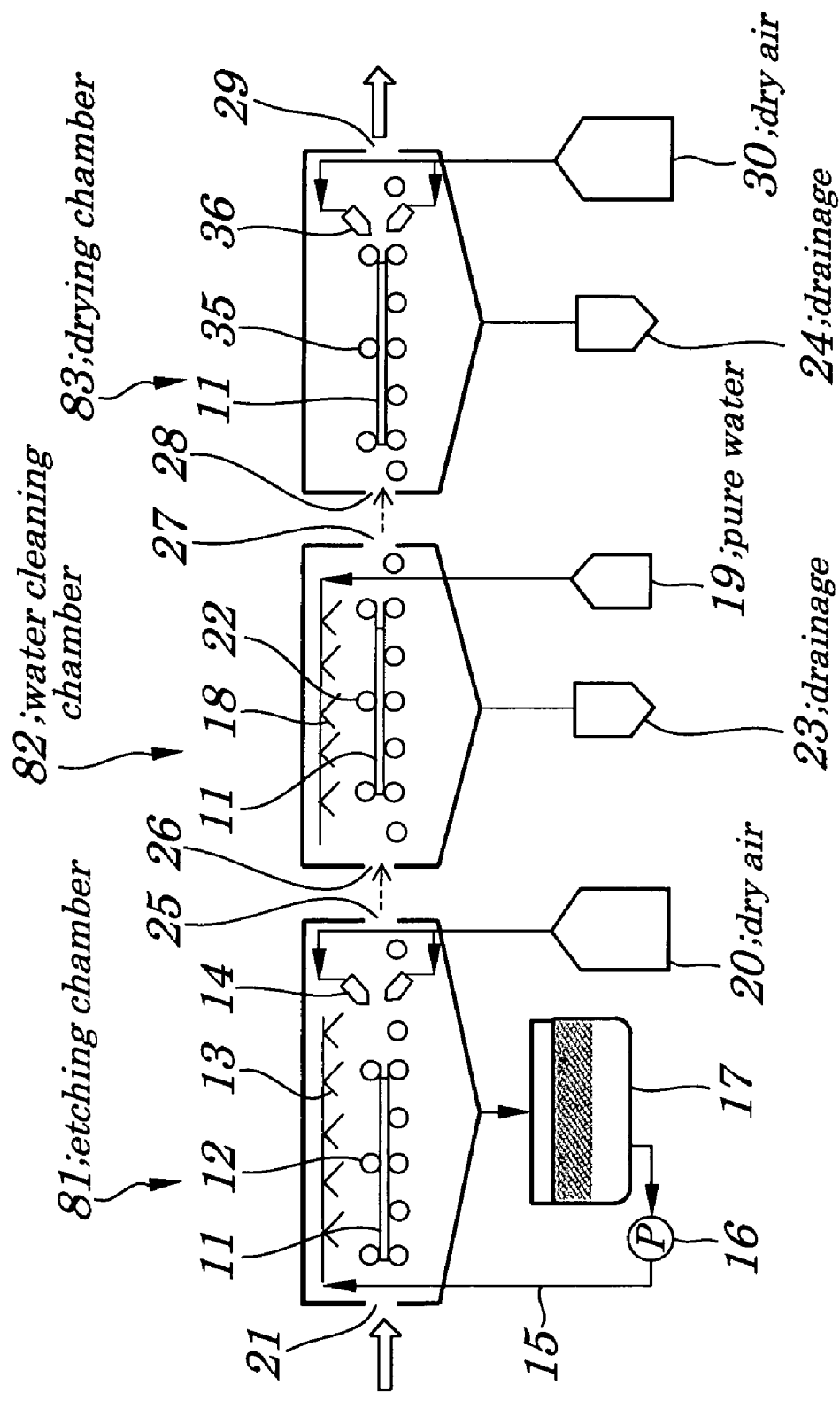
FIG. 1 is a conceptual diagram showing configurations of a wet etching system according to a first embodiment of the present invention.
Figure 2A:
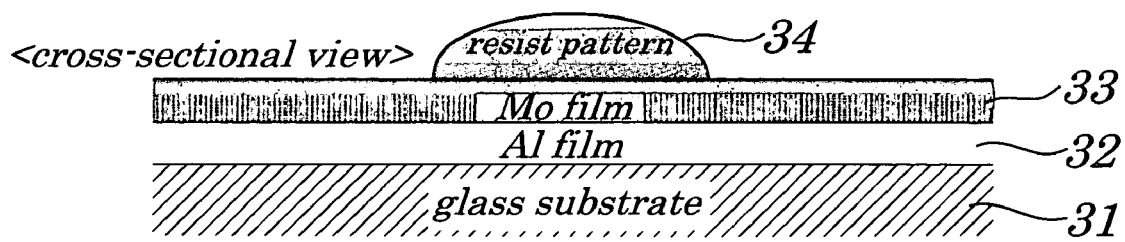
FIG. 2A is a cross-sectional view showing stacked layers and a resist pattern according to the first embodiment of the present invention.
Figure 2B:
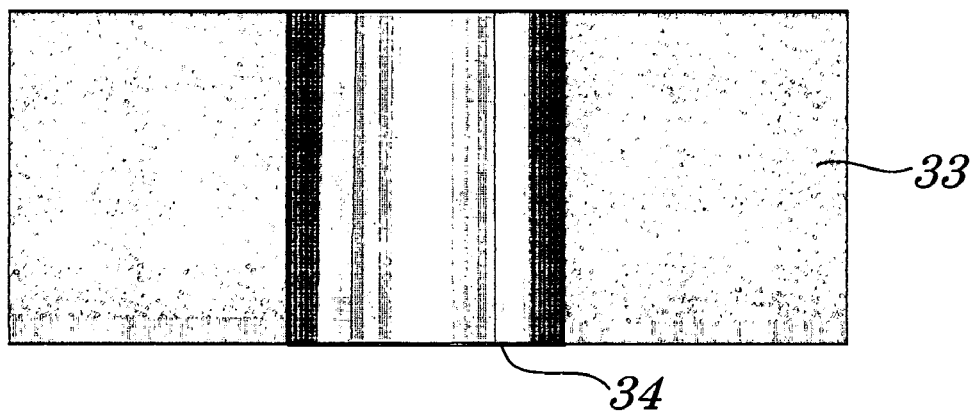
FIG. 2B is a plan view showing stacked layers and a resist pattern according to the first embodiment.

FIG. 1 is a conceptual diagram showing configurations of a wet etching system 155 according to a first embodiment of the present invention. FIGS. 2A and 2B are diagrams showing a structure of stacked films formed on a substrate to be treated 11 explaining operations of the wet etching system 155 in which an etching process is performed on the substrate to be treated 11 according to the first embodiment of the present invention. Moreover, the stacked films shown in FIG. 2A are used as a wiring pattern in a liquid crystal display device.

First, an outline of configurations of the wet etching system 155 is described by referring to FIG. 1. As shown in FIG. 1, the wet etching system 155 of the first embodiment includes an etching chamber 81, a water cleaning chamber 82, and a drying chamber 83. The etching chamber 81 is made up of a plurality of carrying rollers 12, a plurality of etching spray nozzles 13, at least one air knife 14, an etching liquid tank 17, a pipeline 15, a pump 16, a dry air tank 20, an incoming port 21, and an outgoing port 25. The water cleaning chamber 82 is made up of a plurality of carrying rollers 22, a pure water tank 19, a plurality of pure water spray nozzles 18, a drain pipe 23, an incoming port 26, and an outgoing port 27. The drying chamber 83 is made up of a plurality of carrying rollers 35, a dry air tank 30, a drain pipe 24, at least one air knife 36, an incoming port 28, and an outgoing port 29.

Next, the structure of the stacked films formed on the substrate to be treated 11 is described by referring to FIGS. 2A and 2B. As shown in FIG. 2A (cross-sectional view), an Al (aluminum) film 32 is deposited on a glass substrate 31 by using, for example, a sputtering method so that its film thickness is about 100 nm. Then on the Al film 32 is deposited a Mo (molybdenum) film 33 by using, for example, the sputtering method so that its film thickness is about 70 nm. Further, patterning operations are also performed on a resist film 34 deposited on the Mo film 33 in a manner so as to form a wiring pattern. FIG. 2B (plan view) shows the diagram of the Mo film 33 and the resist film 34 viewed from an upper direction.

Then, a difference in an etching rate between the chemical compositions of the etching liquid occurring when an etching process is performed on the stacked films 32 and 33 (Al film 32 and Mo film 33 in the embodiment) is explained. When the stacked films 32 and 33 are etched by singly using a spray etching method (dynamic wet etching method using a dynamic etching liquid) and by singly using a paddle etching method (static wet etching method using a static etching liquid) and when an etching liquid having the following chemical composition is used, following large and small relations of an etching rate between the stacked films 32 and 33 can be obtained. That is, when an etching liquid having a typical mixed chemical composition containing 79.0% of a phosphoric acid, 3.2% of an acetic acid, and 0.5% of a nitric acid, following large and small relations in the etching rate occur between the stacked films 32 and 33. When the spray etching process is performed, an etching rate of the Al film 32 is larger than that of the Mofilm 33. When thepaddle etching process is performed, an etching rate of the Mo film 33 is larger than that of the Al film 32.

When the spray etching process or the paddle etching process is singly performed by using the etching liquid described above, in the case of the spray etching, the etching rate of the Mo film 33 is 166 nm and the etching rate of the Al film 32 is 416 nm and in the case of the paddle etching, the etching rate of the Mo film 33 is 250 nm and the etching rate of the Al film 32 is 166 nm.

Next, operations of the wet etching system 155 and states in which the Al film 32 and Mo film 33 formed on the substrate to be treated 11 are etched are described by referring to FIG. 1. As shown in FIG. 1, a spray etching process is performed by spraying, using the etching spray nozzles 13 attached in a plurality of steps in the etching chamber 81, the etching liquid being fed from the etching liquid tank 17 by the pump 16 through the pipeline 15, on a surface of the substrate to be treated 11 being carried by the carrying roller 12 through the incoming port 21 of the etching chamber 81 into the etching chamber 81, for a period of specified time of, for example, 25 seconds.

Figure 3A:
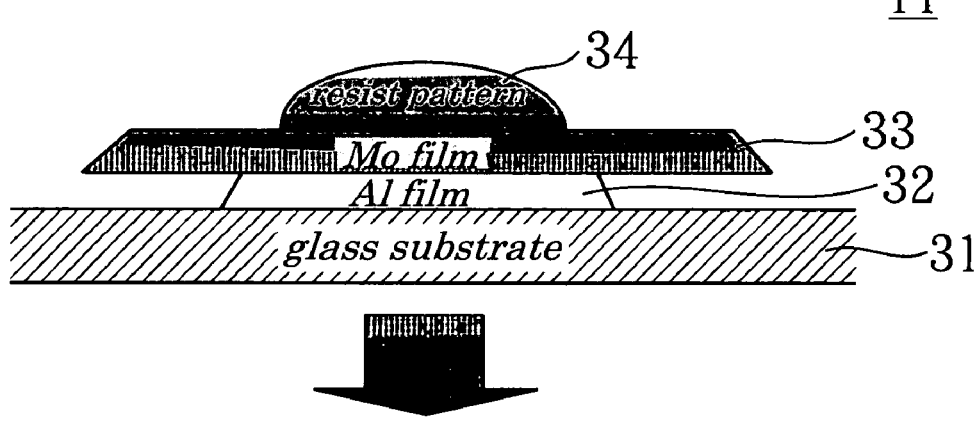
FIGS. 3A and 3B are process diagram for illustrating etching processes on stacked layers according to the first embodiment of the present invention.

Next, as shown in FIG. 3A, after the spray etching process has been performed, due to the relations of the etching rate described above, a side edge (film edge) of the Al film 32 serving as a lower layer is put in a retreated state relative to the Mo film 33 serving as an upper layer. When a side-etching phenomenon occurred generally on partial portions of side edges of the Al film 32 and Mo film 33 outside the resist pattern 34 ends and then the glass substrate 31 begins to be exposed, the spraying of the etching liquid is stopped. At this time, since the etching liquid stays all over the substrate to be treated 11, by allowing the substrate to be treated 11 to stay in the etching chamber 81, as it is, for a period of time of, for example, 70 seconds, the etching on the stacked films 32 and 33 further progresses thus making the paddle etching process be completed.

Figure 3B:
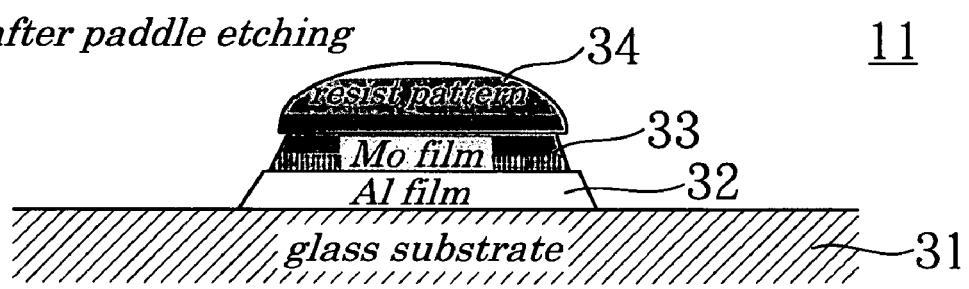

Moreover, as shown in FIG. 3B, as the paddle etching progresses, due to the relations of the etching rate described above, a side edge of the Mo film 33 serving as the upper layer which had protruded relative to the side edge of the Al film 32 serving as the lower layer has retreated and, as a result, distances between the side edge of the Al film 32 and the side edge of the Mo film 33 have shortened. Finally, as shown in FIG. 3B, the paddle etching ends at a time point when shapes of the side edge as a whole of the stacked films 32 and 33 become quasi-tapered and then the substrate to be treated 11 is moved into the water cleaning chamber 82. In the water cleaning chamber 82, the etching liquid being left on the surface of the substrate to be treated 11 is washed away and the progress of the etching is made to be stopped.

That is, as shown in FIG. 1, in the water cleaning chamber 82, by spraying, using the pure water spray nozzle 18, pure water fed from the pure tank 19 on the substrate to be treated 11 having undergone the etching process, cleaning is performed for a period of specified time, for example, 200 seconds and the etching liquid having been removed from the substrate to be treated 11 is discharged through the drain pipe 23. After the cleaning process, the substrate to be treated 11 is carried out from the outgoing port 27 of the water cleaning chamber 82 and then into the drying chamber 83.

In the drying chamber 83, by jetting dry air fed from the dry air tank 30 on the substrate to be treated 11, pure water being left on the surface of the substrate to be treated 11 is removed and the surface of the substrate to be treated 11 is dried. The cleaning liquid used for the cleaning is discharged from the drain pipe 24. After the drying process has been completed, the substrate to be treated 11 is carried out from the outgoing port 29 of the drying chamber 83.

In the embodiment, order of the spray etching and the paddle etching may be interchanged. When the paddle etching process is first performed, if the etching system made up of the etching chamber 81, water cleaning chamber 82, and drying chamber 83 has a function (pre-wetting function) of applying a coating of the etching liquid to the surface of the substrate to be treated 11 as pre-treatment with an aim of improving wettability, the paddle etching process can be performed by using the pre-wetting function, that is, by using the etching liquid applied to the surface of the substrate to be treated 11.

In the case of interchanging order of the spray etching and paddle etching, operations of the wet etching system 155 of the embodiment are as follows. That is, after the paddle etching process has been performed for a period of time of about 70 seconds, the spray etching process is performed on the substrate to be treated 11 by spraying the etching liquid for a period of time of, for example, about 25 seconds. After a lapse of predetermined time for the spray etching process, the spraying of the etching liquid on the substrate to be treated 11 is stopped. By jetting dry air fed from the dry air tank 20 on the substrate to be treated 11, the etching liquid being left on the substrate to be treated 11 is removed and the etching process ends. Then, the substrate to be treated 11 is carried out from the outgoing port 25 of the etching chamber 81 and then into the water cleaning chamber 82 from the incoming port 26.

Even if the Al film 32 and the Mo film 33 are stacked in reverse order, that is, even in the case where the Mo film 33 is first deposited on the glass substrate 31 by, for example, a sputtering method and then the Al film 32 is deposited on the Mo film 33 by using, for example, the sputtering method, the wet etching method of the embodiment can be realized. Moreover, the wet etching method of the embodiment has an advantage in that, since the wet etching system for the general spray etching method is used, by finding out combined order of the wet etching processes that can be suitable to material properties of double-stacked film and proper time for the etching process, the wet etching method of the embodiment can be executed without modifying the wet etching system in particular. For example, even if the Al film 32 and Mo film 33 shown in FIG. 2A are stacked in reverse order, order of the spray etching process and paddle etching process can be interchanged so as to be suitable to the reversed order of the etching process. Thus, as described above, according to the embodiment, in the wet etching on two-layered films made up of two kinds of films each having a different film property, the spray etching and paddle etching processes can be performed in a collective manner.

Second Embodiment

Figure 4A:
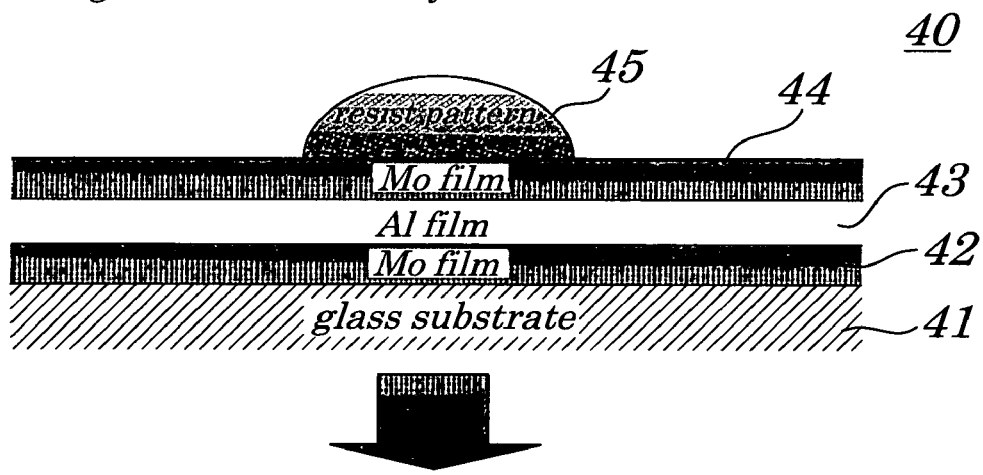
FIGS. 4A, 4B and 4C are process diagrams for showing etching processes on stacked films according to a second embodiment of the present invention.
Figure 4B:
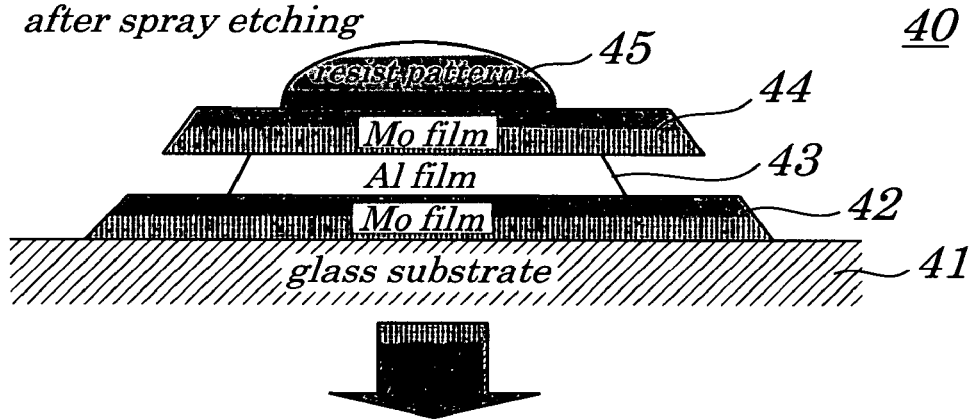
Figure 4C:
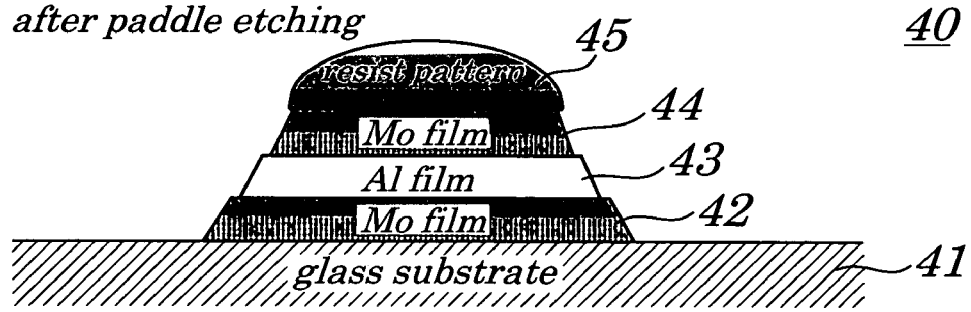
Figure 5:
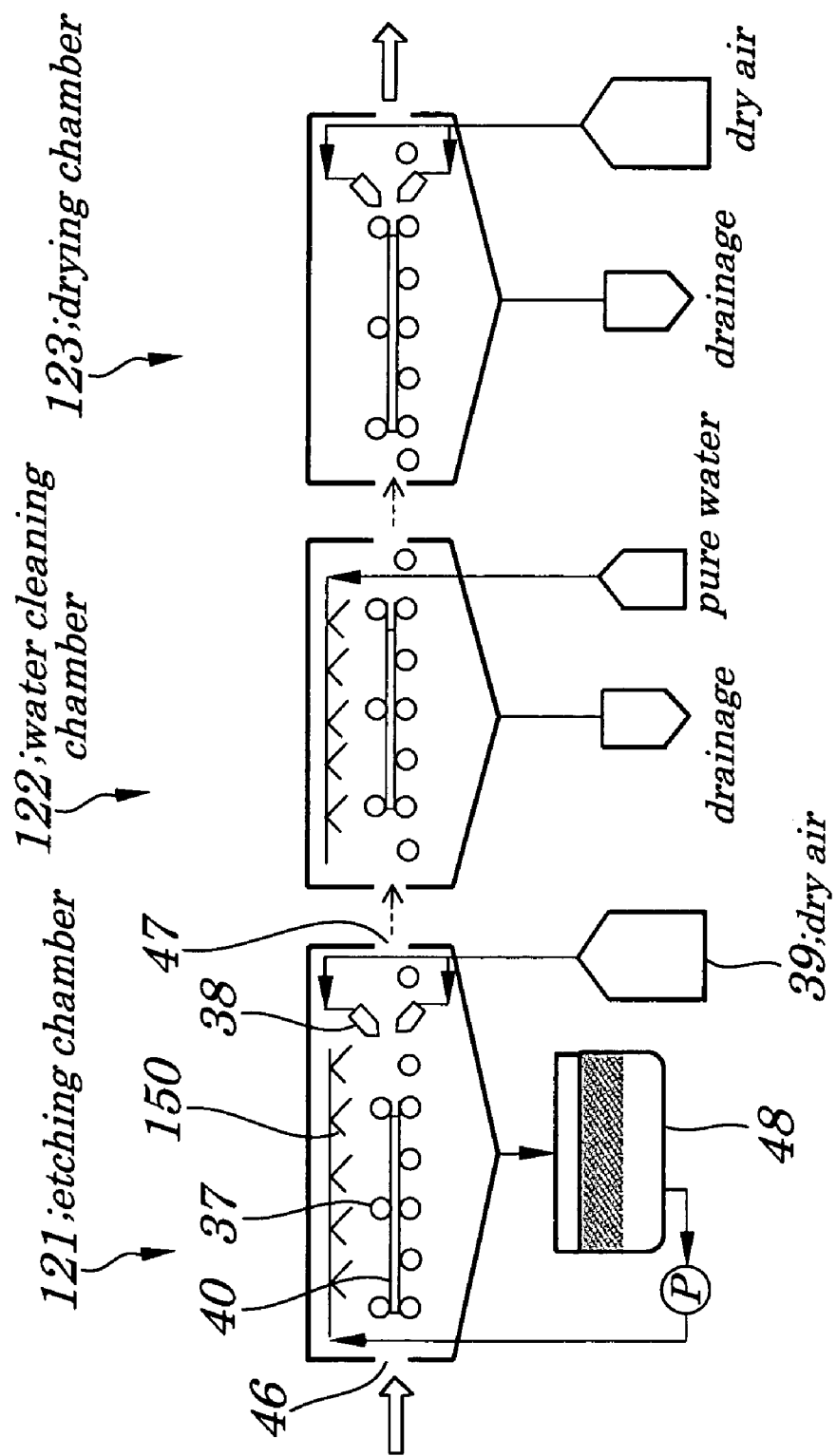
FIG. 5 is a diagram illustrating configurations of a wet etching system according to the second embodiment of the present invention.

An example is described in which a spray etching process and a paddle etching process are performed on three-layered films formed on a substrate to be treated 40 shown in FIGS. 4A, 4B, and 4C by a wet etching system 156 shown in FIG. 5. As shown in FIGS. 4A, 4B, and 4C, the three-layered films are so configured in a manner that an Al film 43 is sandwiched between Mo films 42 and 44. In the substrate to be treated 40 as shown in FIG. 4A, the Mo film 42 is formed on the glass substrate 41 by using, for example, a sputtering method so that its film thickness is about 70 nm, the Al film 43 is deposited on the Mo film 42 by using, for example, the sputtering method so that its film thickness is about 100 nm, and the Mo film 44 is deposited on the Al film 43 by using, for example, the sputtering method so that its film thickness is about 70 nm. Patterning operations are performed on a resist film 45 deposited on the Mo film 44 in a manner so as to form a wiring pattern.

Next, configurations of the wet etching system 156 are described by referring to FIG. 5. The wet etching system 156 of the second embodiment, as shown in FIG. 5, includes an etching chamber 121, a water cleaning chamber 122, and a drying chamber 123. The etching chamber 121 is made up of a carrying roller 37, an etching spray nozzle 150, an air knife 38, an etching liquid tank 48, a dry air tank 39, an incoming port 46, and an outgoing port 47. Configurations of the etching chamber 121, the water cleaning chamber 122, and the drying chamber 123 other than described above are the same as those of the etching chamber 81, the water cleaning chamber 82, and drying chamber 83 in the wet etching system 155 shown in FIG. 1.

When the stacked films 42, 43, and 44 formed on the substrate to be treated 40 are etched singly by using the spray etching method and by using the paddle etching method and when an etching liquid having the same chemical composition as employed in the first embodiment is used, large and small relations of an etching rate among the Mo films 42 and 44, and the Al film 43 can be obtained in a similar manner as in the first embodiment.

Next, states in which the wet etching process of the second embodiment are performed on the stacked films 42, 43, and 44 formed on the substrate to be treated 40 are explained. In FIG. 5, when the substrate to be treated 40 is carried into the etching chamber 121 in the wet etching system 156 from the incoming port 46 and then the spray etching process is performed. The etching liquid is sprayed through the etching spray nozzle 150 on the stacked films 42, 43, and 44 formed on the substrate to be treated 40 for a period of time of about 36 seconds.

At this point, as shown in FIG. 4B, after the spray etching process has been performed, due to the same relations of the etching rate as shown in the first embodiment, a side edge (film edge) of the Al film 43 serving as an intermediate layer is put in a retreated state relative to the side edges of the Mo film 44 serving as an upper layer and of the Mo film 42 serving as a lower layer. Since the side-etching phenomenon progresses even during a period before the Mo film 42 serving as the lower layer is exposed, the side edge of the Mo film 44 serving as the upper layer is put in a retreated state relative to the side edge of the Mo film 42 serving as the lower layer. When the etching process performed generally on the stacked films outside the resist pattern 45 ends and then the glass substrate 41 begins to be exposed, the spraying of the etching liquid is stopped.

Then, as in the case of the first embodiment, by performing the paddle etching process in the etching chamber 121, the stacked films 42, 43, and 44 are further etched. At this point, due to the relations of the etching rate described above, side edges of the Mo film 44 serving as the upper layer and of the Mo film 42 serving as the lower layer which have protruded relative to the side edge of the Al film 43 serving as the intermediate layer retreat and, as a result, distances between the side edge of the Al film 43 and the side edge of the Mo film 44 and between the side edge of the Al film 43 and the side edge of the Mo 42 are shortened. Finally, as shown in FIG. 4C, shapes of all the side edges of the stacked films 42, 43, and 44 become quasi-tapered. After the wet etching processes have been completed, as in the case of the first embodiment, the etching liquid is removed in the water cleaning chamber 122 and pure water is removed in the drying chamber 123.

When a difference in an etching rate occurs when a single etching process is performed as in the case of the Mo film 42 serving as the lower layer and the Mo film 44 serving as the upper layer, the etching method of the second embodiment is applicable irrespective of order of stacking of layers, the number of stacked films, and a film property.

Thus, in the wet etching of three-layered films made up of two kinds of films each having a different film property, it is possible to perform the spray etching process and paddle etching process in a collective manner and to interchange order of the spray etching and paddle etching, which enables the wet etching process to be performed so as to be suitable to a film property of each of the three-layered films.

Third Embodiment

Figure 6:
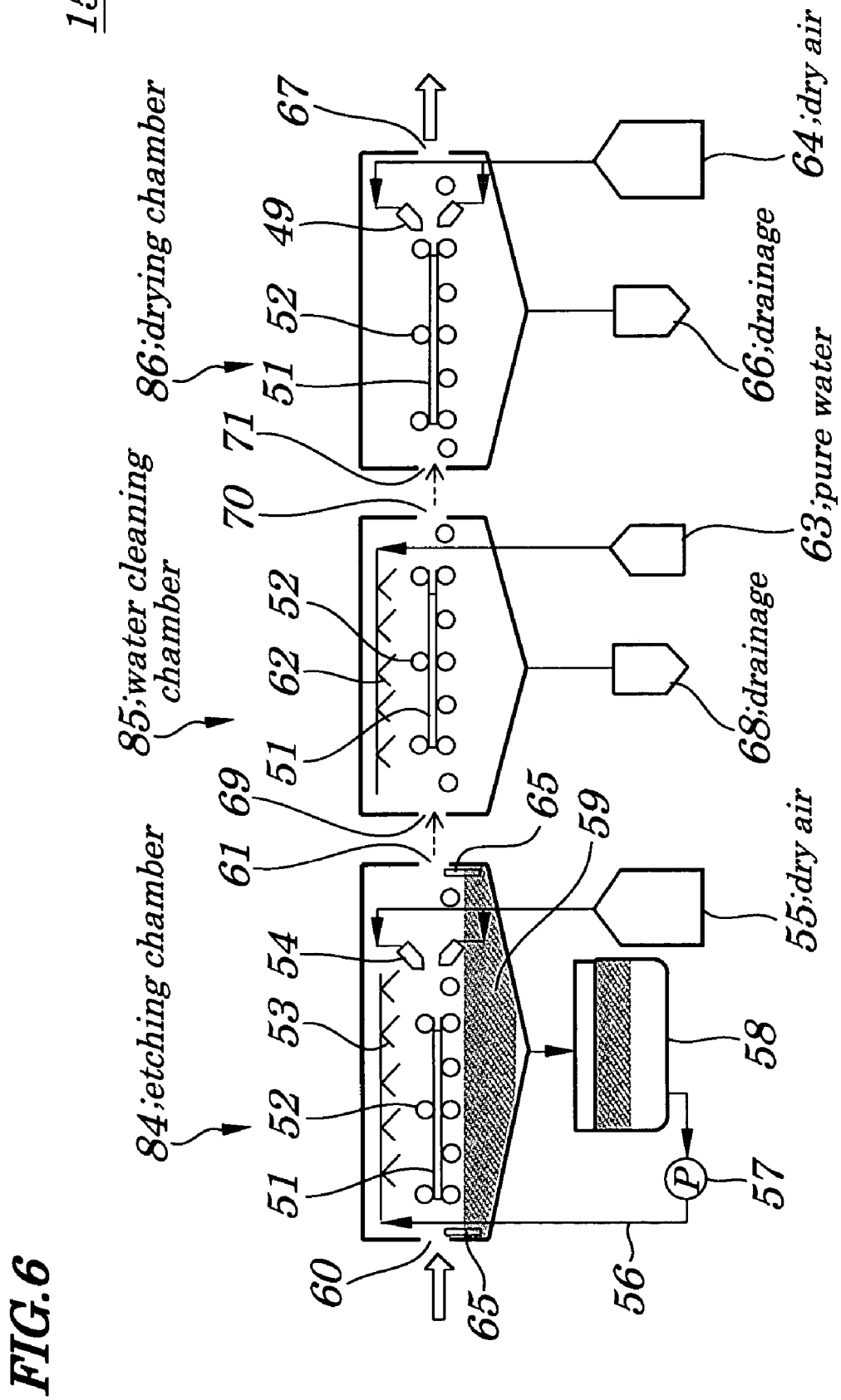
FIG. 6 is a diagram illustrating configurations of a wet etching system according to a third embodiment of the present invention.

In a third embodiment, instead of the paddle etching method employed in the second embodiment, an immersion etching method is used. FIG. 6 is a diagram illustrating configurations of a wet etching system 157 used in the third embodiment.

Figure 7A:
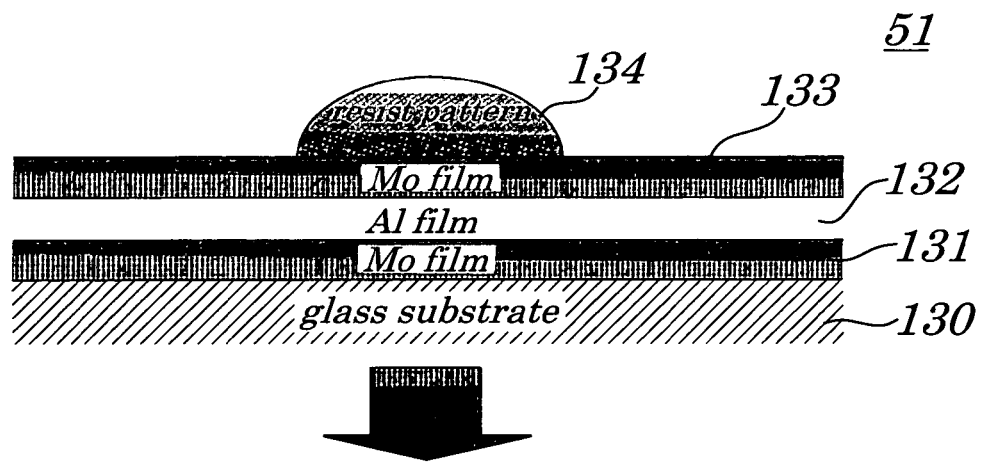
FIGS. 7A, 7B and 7C are process diagrams illustrating etching processes on stacked films according to the third embodiment of the present invention.
Figure 7B:
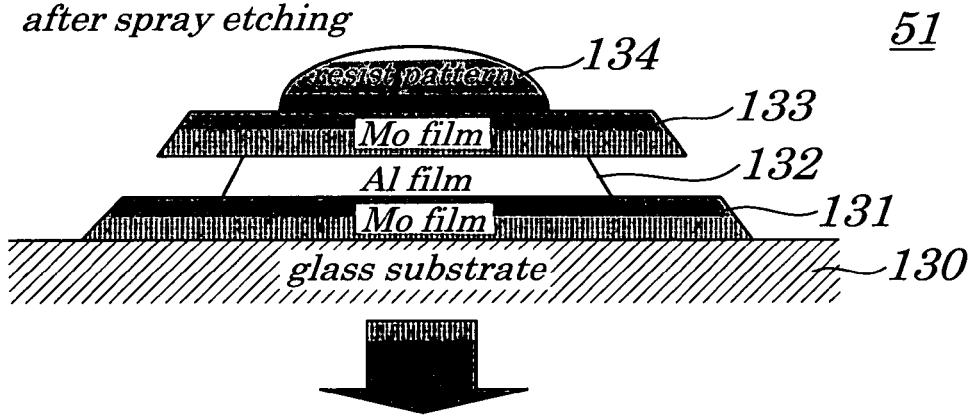
Figure 7C:
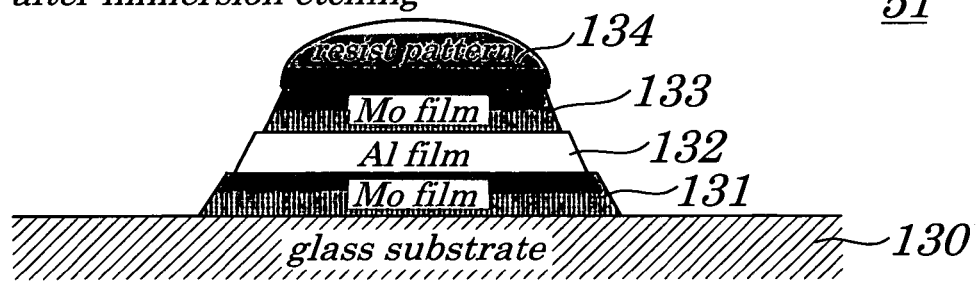

FIGS. 7A, 7B and 7C are process diagrams showing etching processes performed on stacked films 131, 132, and 133 formed on a substrate to be treated 51 according to the third embodiment. Structures of the stacked films 131, 132, and 133 made up of three layers are the same as those in the second embodiment. That is, in the substrate to be treated 51 as shown in FIG. 7A, the Mo film 131 is deposited on a glass substrate 130 by using, for example, a sputtering method so that its film thickness is about 70 nm, the Al film 132 is deposited on the Mo film 131 by using, for example, the sputtering method so that its film thickness is about 100 nm, and the Mo film 133 is deposited on the Al film 132 by using, for example, the sputtering method so that its film thickness is about 70 nm. Patterning operations are performed on a resist film 134 deposited on the Mo film 133 in a manner to form a wiring pattern.

Next, configurations of the wet etching system 157 in which a spray etching process and immersion etching process are performed on the substrate to be treated 51 are described. As shown in FIG. 6, the wet etching system 157 of the third embodiment includes an etching chamber 84, a water cleaning chamber 85, and a drying chamber 86.

Also, the etching chamber 84 is made up of a carrying roller 52, an etching spray nozzle 53, an air knife 54, a etching liquid tank 58, a pipeline 56, a pump 57, a dry air tank 55, an incoming port 60, and an outgoing port 61. The water cleaning chamber 85 is made up of a carrying roller 52, a pure water tank 63, a pure water spray nozzle 62, a drain pipe 68, an incoming port 69, and an outgoing port 70. The drying chamber 86 is made up of a carrying roller 52, a dry air tank 64, a drain pipe 66, an air knife 49, and incoming port 71, and an outgoing port 67.

Next, operations of the wet etching system 157 in which the etching process is performed on the substrate to be treated 51 are described. As shown in FIG. 6, the spray etching process is performed by spraying, using the etching spray nozzle 53, an etching liquid fed through the pipeline 56 and the pump 57 from the etching liquid tank 58, on a surface of the substrate to be treated 51 being carried by the carrying roller 52 through the incoming port 60 to the etching chamber 84, for a period of specified time of, for example, 36 seconds.

When the stacked films 131, 132, and 133 formed on the substrate to be treated 51 are etched singly by using the spray etching method and singly by using the immersion etching method and when an etching liquid having the same chemical composition as employed in the first embodiment is used, large and small relations of an etching rate among the Mo films 131 and 133, and the Al film 132 can be obtained in a similar manner as in the first embodiment.

That is, as shown in FIG. 7B, after the spray etching process has been performed, due to the relations of the etching rate among the stacked films 131, 132, and 133, a side edge of the Al film 132 serving as an intermediate layer is put in a retreated state relative to side edges of the Mo film 133 serving as an upper layer and the Mo film 131 serving as a lower layer. Moreover, since a side-etching phenomenon on the Mo film 133 serving as the upper film progresses even during a period before the Mo film 131 serving as the lower layer is exposed, the side edge of the Mo film 133 serving as the upper layer is put in a retreated state relative to the side edge of the Mo film 131 serving as the lower layer. When the etching process performed generally on the stacked films outside the resist pattern 134 ends and then the glass substrate 130 begins to be exposed, the spraying of the etching liquid is stopped.

Next, the immersion etching process is performed, by closing the incoming port 60 and outgoing port 61 using the shutter 65 in the etching chamber 84 and by filling the etching chamber 84 with the same etching liquid 59 as employed at the time of the spray etching to a degree to which the substrate to be treated 51 is fully immersed, for a period of time of, for example, 170 seconds.

By performing the immersion etching process, the stacked films 131, 132, and 133 are further etched. Due to the relations of the etching rate among the three-layered film, side edges of the Mo film 133 serving as the upper layer and of the Mo film 131 serving as the lower layer which had protruded relative to the side edge of the Al film 132 serving as the intermediate layer retreat and, as a result, distances between the side edge of the Al film 132 and the side edge of each of the Mo films 131 and 133 is shortened. That is, as shown in FIG. 7C, shapes of all the side edges of the stacked films 131, 132, and 133 become quasi-tapered.

Next, in the water cleaning chamber 85, pure water fed from the pure tank 63 is sprayed, by using the pure water spray nozzle 62, on the substrate to be treated 51 having undergone the etching process, for cleaning for a period of specified time of, for example, 200 seconds to remove the etching liquid being left on the substrate to be treated 51. The etching liquid having removed from the substrate to be treated 51 is discharged through the drain pipe 68 and the substrate to be treated 51 is carried out through the outgoing port 70 from the water cleaning chamber 85 and then into the drying chamber 86 through the incoming port 71.

Furthermore, in the drying chamber 86, pure water being left on the substrate to be treated 51 is removed by jetting dry air fed from the dry air tank 64 on the substrate to be treated 51 and the pure water having been removed from the substrate to be treated 51 is discharged from the drain pipe 66. After the drying process has been completed, the substrate to be treated 51 is carried out through the outgoing port 67 in the drying chamber 86. Since the immersion etching is performed in the static etching liquid as in the case of the paddle etching, when a same etching liquid is used, the same etching characteristic on each film as obtained in the case of the paddle etching can be achieved.

The etching method employed in the third embodiment is applicable, without problems, to stacked films made up of even two layers in the substrate to be treated 51 as in the case of the first embodiment. Therefore, also in the third embodiment, same effects as obtained in other embodiments can be achieved. Moreover, in the third embodiment, order of the etching processes can be interchanged, that is, the immersion etching may be performed after the spray etching process has been completed or the spray etching may be performed after the immersion etching process has been completed.

That is, if the spray etching process is performed after the immersion etching has been completed, after a lapse of the above specified time for the spray etching, the spraying of the etching liquid on the substrate to be treated 51 is stopped. The etching liquid 59 staying in the etching chamber 84 is discharged into the etching liquid tank 58. By jetting dry air fed from the dry air tank 55 using the air knife 54, the etching liquid being left on the surface of the substrate to be treated 51 is removed. After termination of the etching processes, the substrate to be treated 51 is carried out through the outgoing port 61 in the etching chamber 84 and then into the water cleaning chamber 85 through the incoming port 69.

Thus, in the wet etching process to be performed on two-layered films or three-layered films made up of two or three kinds of films each having a different film property, by performing the spray etching process and paddle etching process in a collective manner or the spray etching process and immersion etching process in a collective manner, an amount of side-etching on each stacked films can be controlled, thus achieving uniformed side edges of the three-layered films. Moreover, it is possible that order of the spray etching and paddle etching or order of the spray etching and immersion etching can be reversed, thus enabling a process window to be expanded.

As a modified embodiment of the third embodiment, another etching method is possible. That is, in the case of the two-layered film or the three-layered film as shown in FIGS. 3A and 3B and FIGS. 4A, 4B and 4C, when the chemical composition of the etching liquid to be used for the immersion etching is different from that of the etching liquid to be used for the paddle etching, if a difference in the etching rate occurs between the layer having undergone the immersion etching and the layer having undergone the paddle etching, it is possible that the immersion etching and paddle etching is used in combination.

As another modified embodiment of the third embodiment, in the case of the two-layered film or the three-layered film as shown in FIGS. 3A and 3B and FIGS. 4A, 4B and 4C, or in the case of three-layered films made of film materials each having a different film property, when the chemical composition of the etching liquid to be used for the immersion etching is different from that of the etching liquid to be used for the paddle etching, if a difference in the etching rate occurs among the layer having undergone the spray etching, the layer having undergone the immersion etching, and the layer having undergone the paddle etching, it is possible that the etching method with all the spray etching, immersion etching, and paddle etching being combined is employed.

Fourth Embodiment

Figure 8:
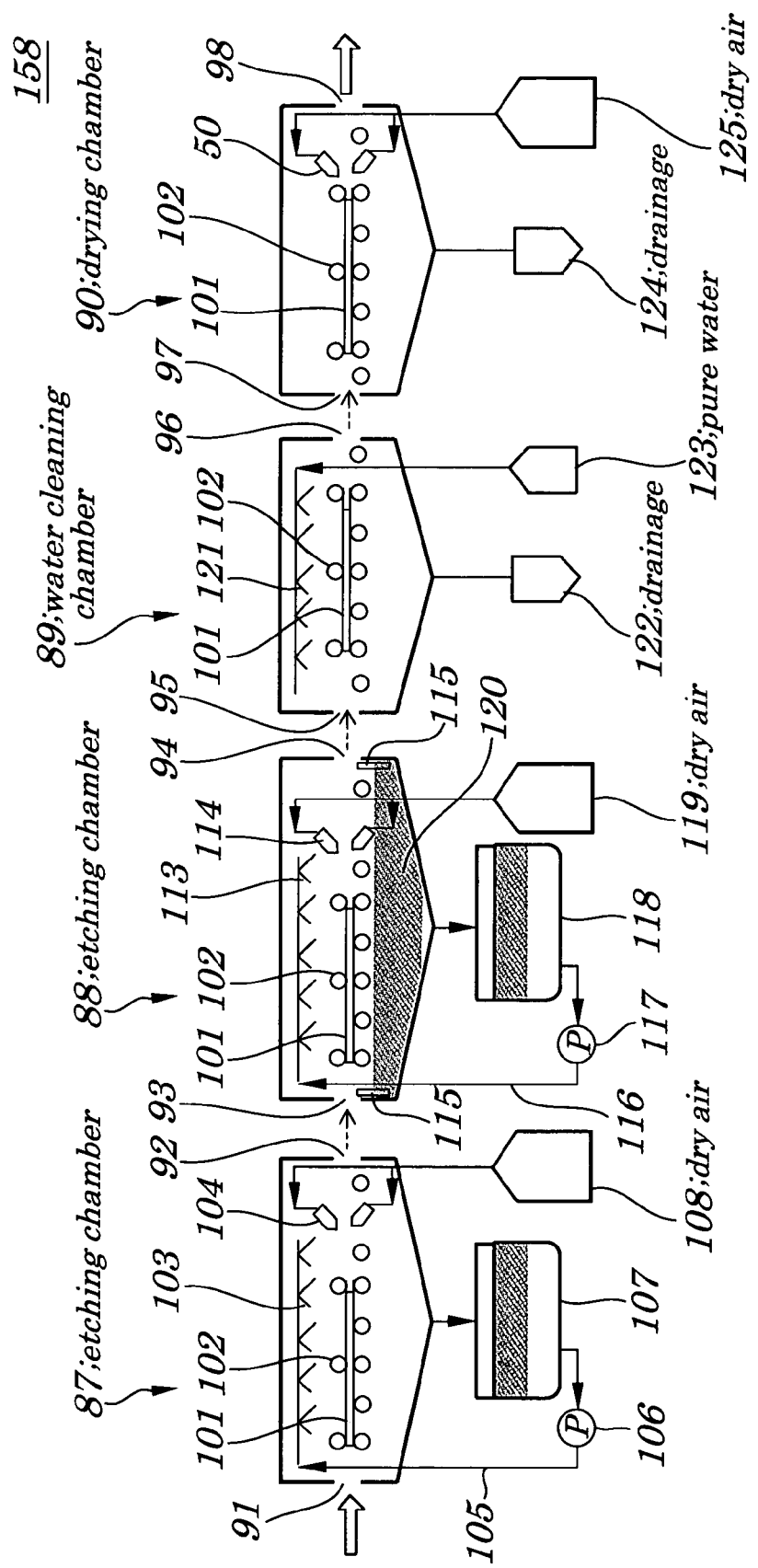
FIG. 8 is a diagram showing configurations of a wet etching system according to a fourth embodiment of the present invention.

In a fourth embodiment, two different etching processes are consecutively performed in two etching chambers being adjacent to each other. FIG. 8 is a conceptual diagram showing configurations of a wet etching system 158 employed in the fourth embodiment in which a spray etching process and an immersion etching process are performed in two different etching chambers 87 and 88.

Figure 9A:
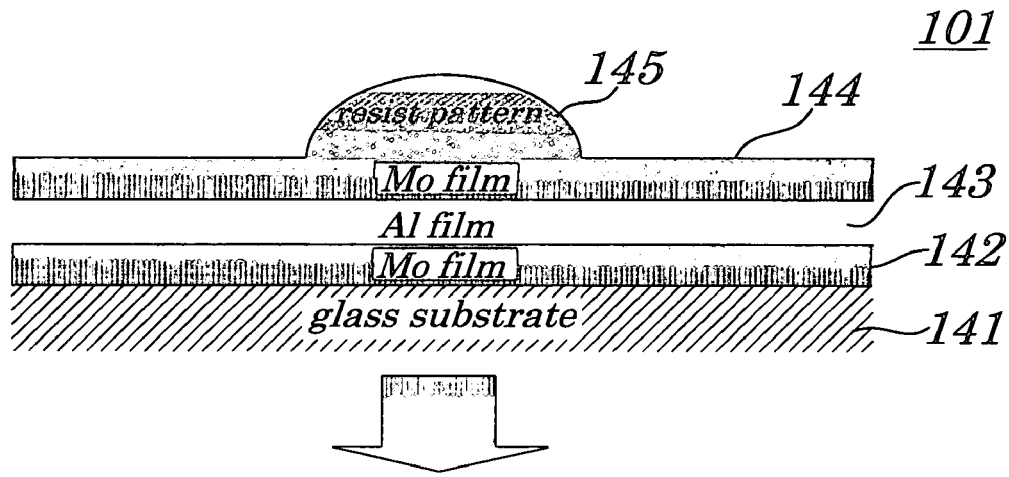
FIGS. 9A, 9B and 9C are process diagrams for illustrating etching processes on stacked films according to the fourth embodiment of the present invention.
Figure 9B:
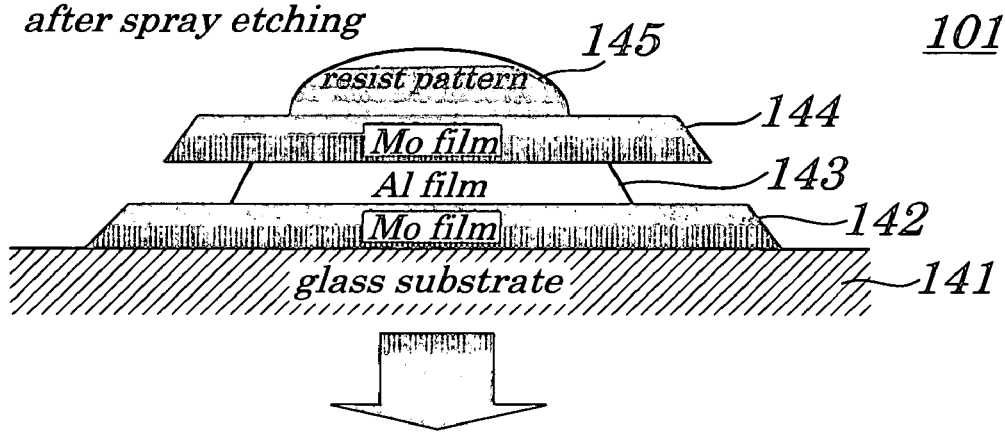
Figure 9C:
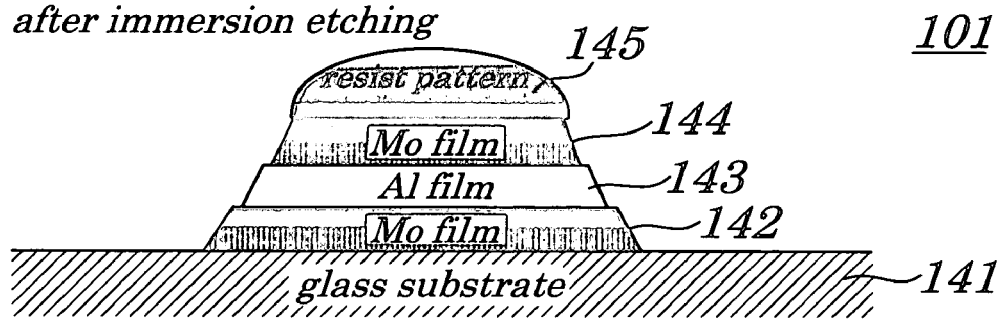

In FIGS. 9A, 9B and 9C, shown is a substrate to be treated 101 on which etching processes are performed in the wet etching chamber 158. The stacked films 142, 143, and 144 made up of three layers shown in FIGS. 9A, 9B and 9C have the same configurations as the stacked films employed in the second embodiment. That is, in the substrate to be treated 101 shown in FIG. 9A (cross-sectional view), the Mo film 142 is deposited on the glass substrate 141 by using, for example, a sputtering method so that its film thickness is about 70 nm, the Al film 143 is deposited on the Mo film 142 by using, for example, the sputtering method so that its film thickness is about 100 nm, and the Mo film 144 is deposited on the Al film 143 by using, for example, the sputtering method so that its film thickness is about 70 nm. Patterning operations are performed on a resist film 145 deposited on the Mo film 144 in a manner to form a wiring pattern.

Next, configurations of the wet etching system 158 of the fourth embodiment in which the spray etching and immersion etching processes are performed on the substrate to be treated 101 are described. As shown in FIG. 8, the wet etching system 158 of the fourth embodiment is made up of etching chambers 87 and 88, a water cleaning chamber 89, and a drying chamber 90.

The etching chambers 87 is made up of a carrying roller 102, an etching spray nozzle 103, an air knife 104, a etching liquid tank 107, a pipelines 105, a pump 106, a dry air tank 108, an incoming port 91, and an outgoing port 92. The etching chamber 88 is made up of a carrying roller 102, an etching spray nozzle 113, an air knife 114, a etching liquid tank 118, a pipeline 116, a pump 117, a dry air tank 119, an incoming port 93, and an outgoing port 94.

The water cleaning chamber 89 is made up of a carrying roller 102, a pure water tank 123, a pure spray nozzle 121, a drain pipe 122, an incoming port 95, and an outgoing port 96. The drying chamber 90 is made up of a carrying roller 102, a dry air tank 125, a drain pipe 124, an air knife 50, an incoming port 97, and an outgoing port 98.

Next, states in which the etching process of the fourth embodiment are performed by the wet etching system 158 on the substrate to be treated 101 are explained. As shown in FIG. 8, the spray etching process is performed by spraying, using the etching spray nozzle 103, an etching liquid fed through the pipeline 105 and the pump 106 from the etching liquid tank 107 on a surface of the substrate to be treated 101 being carried by the carrying roller 102 through the incoming port 91 to the etching chamber 87, for a period of specified time of, for example, 36 seconds.

When the stacked films 142, 143, and 144 are etched singly by using the spray etching method and singly by using the immersion etching method and when an etching liquid having the same chemical composition as employed in the first embodiment is used, large and small relations of an etching rate among the Mo films 142 and 144, and the Al film 143 can be obtained in a similar manner as in the first embodiment.

That is, as shown in FIG. 9B, after the spray etching process has been performed, due to the relation of the etching rate among the stacked films 142, 143, and 144, a side edge of the Al film 143 serving as an intermediate layer is put in a retreated state relative to the Mo film 144 serving as an upper layer and the Mo film 142 serving as a lower layer. Moreover, since the side-etching phenomenon on the Mo film 144 serving as the upper film progresses even during a period before the Mo film 142 serving as the lower layer is exposed, a side edge of the Mo film 144 serving as the upper layer is put in a retreated state relative to a side edge of the Mo film 142 serving as the lower layer. When the etching process performed generally on the stacked films outside the resist pattern 145 ends and then the glass substrate 141 begins to be exposed, the spraying of the etching liquid is stopped. That is, after a lapse of the above specified time for the spray etching, the spraying of the etching liquid on the substrate to be treated 101 is stopped by the air knife 104.

Next, after the substrate to be treated 101 has been carried through the outgoing port 92 and incoming port 93 into the etching chamber 88, the immersion etching process is performed, by closing the incoming port 93 and outgoing port 94 using the shutter 115 in the etching chamber 88 and by filling the etching chamber 88 with the same etching liquid 120 as employed at the time of the spray etching to a degree to which the substrate to be treated 101 is fully immersed, for a period of time of, for example, 170 seconds.

By performing the immersion etching process, the stacked films 142, 143, and 144 are further etched. That is, due to the relations of the etching rate of the three-layered films, side edges of the Mo film 144 serving as the upper layer and of the Mo film 142 serving as the lower layer which had protruded relative to the side edge of the Al film 143 serving as the intermediate layer retreat and, as a result, distances between the side edge of the Al film 143 and the side edge of the Mo film 144 and between the side edge of the Al film 143 and the side edge of the Mo 142 are shortened. That is, as shown in FIG. 9C, shapes of all the side edges of the stacked films 142, 143, and 144 become quasi-tapered.

Next, in the water cleaning chamber 89, pure water fed from the pure tank 123 is sprayed, by using the pure water spray nozzle 121, on the substrate to be treated 101 having undergone the etching process, for cleaning for a period of specified time of, for example, 200 seconds to remove the etching liquid being left on the substrate to be treated 101. The etching liquid having removed from the substrate to be treated 101 is discharged through the drain pipe 122 and the substrate to be treated 101 is carried out through the outgoing port 96 from the water cleaning chamber 89 and then into the drying chamber 90 through the incoming port 97.

In the drying chamber 90, by jetting dry air fed from the dry air tank 125 on the substrate to be treated 101, pure water being left on the surface of the substrate to be treated 101 is removed and the pure water used for the cleaning is discharged from the drain pipe 124. After the drying process has been completed, the substrate to be treated 101 is carried out from the outgoing port 98 of the drying chamber 90.

By separating the etching chamber in which two types of etching processes are to be performed in the same etching chamber into two etching chambers being serially connected to each other and by performing the two types of the etching processes consecutively and separately in the two etching chambers, time required for performing the etching process in one etching chamber is dispersed, which enables the substrate to be treated 101 to be effectively supplied to a subsequent wafer processing step and thereafter.

Also, by configuring the above two etching chambers being serially connected so that each of the two etching chambers has a function of performing all of the spray etching process, the paddle etching process, and the immersion etching process, a combination and order of these etching processes can be flexibly changed depending on a type of each of the stacked films, which enables wet etching processes on stacked films to be effectively performed.

In the above fourth embodiment, the example is shown in which the spray etching process and the immersion etching process are performed separately in a different etching chamber. However, it is also possible that each of the etching chambers can perform a combined process of the spray etching and paddle etching or a combined process of the paddle etching and immersion etching.

It is apparent that the present invention is not limited to the above embodiments but may be changed and modified without departing from the scope and spirit of the invention. For example, in the above embodiments, the mixed liquid of phosphoric acid, acetic acid, and nitric acid is used as an etching liquid. However, the present invention is not limited to this. Composition of the mixed liquid may be changed, as appropriate, depending on a kind of film to be treated, a number of layers contained in multi-layered films, or order of deposition of film materials.

Also, in the above embodiments, the two-layered films and three-layered films are employed. However, the present invention is not limited to this. Stacked films having four layers or more or having three or more film material properties may be employed.

Also, in the present invention, not only the glass substrate but also a semiconductor substrate made of silicon or a like and other substrates may be used as a substrate. Furthermore, it is needless to say that the deposition material is not limited to aluminum or molybdenum and, whenever necessary, various metal materials, insulation film materials, semiconductor materials may be used and not only inorganic materials but also organic materials may be employed.

What is claimed is:

1. A combined wet etching method for stacked films comprising:

a step of performing wet etching processes employing a plurality of types of wet etching methods in combination and in a collective manner on stacked films formed sequentially on a substrate containing, at least, a first film and a second film each having a different film property; and wherein said plurality of types of wet etching methods comprises:
a first wet etching step in which side-etching on said first film is facilitated more than side-etching on said second film, so that said first film forms a tapered edge; and
a second wet etching step in which side-etching on said second film is facilitated more than side-etching on said first film, so that a shape of a side edge as a whole of said first and second films is quasi-tapered when said plural etching methods are completed.

2. The combined wet etching method for stacked films according to claim 1, wherein a chemical composition of an etching liquid to be used in said first wet etching step and a chemical composition of an etching liquid to be used in said second wet etching step are same.

3. The combined wet etching method for stacked films according to claim 1, wherein, when a dynamic etching liquid is used in said first wet etching step, a static etching liquid is used in said second wet etching step and, when said static etching liquid is used in said first wet etching step, said dynamic etching liquid is used in said second wet etching step.

4. The combined wet etching method for stacked films according to claim 3, wherein an etching step in which said dynamic etching liquid is used is an etching step in which an etching process is performed by spraying an etching liquid on said stacked films deposited on said substrate and an etching step in which said static etching liquid is used is an etching step in which an etching process is performed by immersing said substrate on which said stacked films are deposited in an etching liquid or an etching step in which a coating of an etching liquid is applied to said stacked films deposited on said substrate.

5. The combined wet etching method for stacked films according to claim 1, wherein said stacked films are constructed so that said first film is sandwiched between said second films or so that said second film is sandwiched between said first films.

6. A combined wet etching method for stacked films comprising:
a step of performing wet etching processes employing a plurality of types of wet etching methods in combination and in a collective manner on stacked films deposited sequentially on a substrate containing, at least, a first film and a second film each having a different film property; and
wherein said plurality of types of wet etching methods comprises:
a first wet etching step in which an etching characteristic is obtained that an etching rate of said first film is larger than an etching rate of said second film;
a second wet etching step in which an etching characteristic is obtained that an etching rate of said second film is larger than an etching rate of said first film, so that a shape of edges of said first and second films as a whole are quasi-tapered when said plural etching methods are completed.

7. The combined wet etching method for stacked films according to claim 6, wherein a chemical composition of an etching liquid to be used in said first wet etching step and a chemical composition of an etching liquid to be used in said second wet etching step are same.

8. The combined wet etching method for stacked films according to claim 6, wherein, when a dynamic etching liquid is used in said first wet etching step, a static etching liquid is used in said second wet etching step and, when said static etching liquid is used in said first wet etching step, said dynamic etching liquid is used in said second wet etching step.

9. The combined wet etching method for stacked films according to claim 8, wherein an etching step in which said dynamic etching liquid is used is an etching step in which an etching process is performed by spraying an etching liquid on said stacked films deposited on said substrate and an etching step in which said static etching liquid is used is an etching step in which an etching process is performed by immersing said substrate on which said stacked films are deposited in an etching liquid or an etching step in which a coating of an etching liquid is applied to said stacked films deposited on said substrate.

10. The combined wet etching method for stacked films according to claim 6, wherein said stacked films are constructed so that said first film is sandwiched between said second films or so that said second film is sandwiched between said first films.

11. A combined wet etching method for stacked films comprising:
sequentially forming at least first and second films on a substrate, each of said films having a different film property;
performing a first wet etching process on said first and second films, said first wet etching process etching said first film more than said second film; and
performing a second wet etching process different than said first wet etching process, on said first and second films, said second wet etching process etching said second film more than said first film so that edges of said first and second films as a whole are quasi-tapered after said first and second wet etching processes are completed.

12. The method as claimed in claim 11, wherein the first wet etching is performed before the second wet etching.

13. The method as claimed in claim 11, wherein the second wet etching is performed before the first wet etching.

14. The method as claimed in claim 11, wherein the first and second wet etchings are performed in different etching chambers.

15. The method as claimed in claim 11, wherein said first wet etching process is a dynamic etching process.

16. The method as claimed in claim 15, wherein said second etching process is a static etching process.

* * * * *